US007194709B2

(12) United States Patent
Brankner

(10) Patent No.: US 7,194,709 B2
(45) Date of Patent: Mar. 20, 2007

(54) AUTOMATIC ALIGNMENT OF INTEGRATED CIRCUIT AND DESIGN LAYOUT OF INTEGRATED CIRCUIT TO MORE ACCURATELY ASSESS THE IMPACT OF ANOMALIES

(76) Inventor: Keith John Brankner, 9903 Marseilles Dr., Austin, Travis County, TX (US) 78750

( * ) Notice: Subject to any disclaimer, the term of this patent is extended or adjusted under 35 U.S.C. 154(b) by 460 days.

(21) Appl. No.: 10/793,956

(22) Filed: Mar. 5, 2004

(65) Prior Publication Data
US 2005/0198602 A1    Sep. 8, 2005

(51) Int. Cl.
*G06F 17/50* (2006.01)
(52) U.S. Cl. .................. 716/4; 716/5; 716/19; 716/20; 716/21
(58) Field of Classification Search .................... 716/4, 716/8–10, 19–21; 382/151, 173; 356/237.4, 356/237.5, 239.3; 250/492.3
See application file for complete search history.

(56) References Cited

U.S. PATENT DOCUMENTS

| 4,954,968 A | * | 9/1990 | Yamaguchi et al. | ........ 358/1.13 |
| 5,401,972 A | | 3/1995 | Talbot et al. | ............. 250/491.1 |
| 5,541,411 A | | 7/1996 | Lindquist et al. | ........... 250/309 |
| 5,838,595 A | | 11/1998 | Sullivan et al. | ............. 364/578 |
| 6,028,664 A | * | 2/2000 | Cheng et al. | ............. 356/237.4 |
| 6,262,430 B1 | * | 7/2001 | Li | ............................. 250/492.3 |
| 6,330,053 B1 | | 12/2001 | Takayama | ..................... 355/77 |
| 6,804,394 B1 | * | 10/2004 | Hsu | ............................. 382/173 |
| 2004/0202355 A1 | * | 10/2004 | Hillhouse | .................... 382/124 |

OTHER PUBLICATIONS

Kenneth W. Tobin et al. "Integrated applications of inspection data in the semiconductor manufacturing environment," Oak Ridge National Laboratory, Oak Ridge, Tennessee, International SEMATECH, Austin, Texas, Dec. 14, 2000, 10 pages.

* cited by examiner

*Primary Examiner*—Vuthe Siek
(74) *Attorney, Agent, or Firm*—Michael P. Adams

(57) ABSTRACT

A method, computer program product and system for assessing the impact of anomalies in a physical device. An anomaly may be detected in an integrated circuit. Upon detecting an anomaly, an image of the anomaly may be captured. A design layout of the image may be obtained. The image coordinates of the detected anomaly may be transformed into a common reference system, such as the design layout. By using a common unit of reference instead of different reference systems, automatic coordination of the integrated circuit and the design layout may have to be performed once instead of multiple times for multiple tools. The image coordinates of the detected anomaly may be transformed to the coordinates of a common reference system by vectorizing the image, matching polygons in both the image and the design layout and aligning the image of the anomaly with the design layout of the image.

69 Claims, 8 Drawing Sheets

Left/Right Path Pattern
L-L-R- R-L-L-L-L-R-R-L-L

AUTOMATIC ALIGNMENT OF INTEGRATED CIRCUIT AND DESIGN LAYOUT OF INTEGRATED CIRCUIT TO MORE ACCURATELY ASSESS THE IMPACT OF ANOMALIES

TECHNICAL FIELD

The present invention relates to the field of semiconductor processing, and more particularly to automatically aligning the integrated circuit and the design layout of the integrated circuit to more accurately assess the impact of anomalies.

BACKGROUND INFORMATION

Semiconductor devices, such as integrated circuits, are typically formed on a section of a wafer of semiconductor material, such as silicon. The wafer includes multiple sections where each section is called a die. For example, a wafer having an eight-inch diameter may include up to 600 individual dies. Each die contains an integrated circuit device commonly referred to as a chip.

The surface geometry of the various integrated-circuit components on a die is defined photographically. For example, the surface may be coated with a photosensitive layer and then exposed to light passing through a master pattern on a photographic plate, e.g., photo mask. The main body of the photo mask is a flat and transparent glass plate that defines the circuit pattern which may be a magnified replica (for example, 4x) of the image to be transferred to the surface. The transfer of the image from the photo mask to the surface of the wafer is accomplished through the use of various wavelengths, such as UV light, and a photoresist. Photoresists are chemical compositions containing a light-sensitive material in suspension. Photoresists are coated on the wafer using a variety of techniques, e.g., contact printing, spinning.

Anomalies in the integrated circuit may be detected by using a variety of techniques such as by scanning an electron or ion beam over the surface of the integrated circuit and detecting secondary charged particles. Anomalies, as used herein, may refer to either defects caused by manufacturing system problems, defects that occur without a systematic cause, or design defects. In order to determine the impact of the identified anomalies, the position of the anomalies may have to be identified in a design layout of the integrated circuit.

Typically, the anomalies are identified in the integrated circuit by manually aligning and positioning the design layout and the image of the integrated circuit. Since there is a manual alignment of the integrated circuit and the design layout, the identification of the location of the anomaly in the design layout may be subject to human error. Further, multiple tools designed by different vendors are used to investigate the anomaly and may have different reference systems. Hence, a manual coordination of the integrated circuit and the design layout may have to be performed for multiple tools.

If the anomaly is located in a critical area of the integrated circuit, accurate identification of the anomaly may be particularly important. Critical areas may correspond to areas of the integrated circuit that have the tightest performance limits relative to a nominal design specification. If the anomaly is incorrectly identified as being located outside a critical area, then the impact of the anomaly may not be fully realized. Consequently, the analysis of the impact of the anomaly may be deficient.

Further, anomalies may also be assessed by classifying the anomalies in certain categories based on features of the anomaly. For example, anomalies that contain certain characteristics may be classified in particular categories. However, by categorizing anomalies based on their own characteristics, the impact of the anomaly on surrounding circuitry is not assessed.

Therefore, there is a need in the art to automatically and reliably align the integrated circuit and the design layout across multiple tools designed by different vendors. Further, there is a need in the art to more fully assess the impact of the anomalies identified in the integrated circuits.

SUMMARY

The problems outlined above may at least in part be solved in some embodiments by detecting an anomaly in an integrated circuit being viewed. Upon detecting an anomaly, an image of the integrated circuit containing the anomaly along with surrounding features and landmarks may be captured. A design layout of the image of the detected anomaly may be obtained. The image coordinates of the detected anomaly may be transformed to the coordinates of a common reference system, such as the design layout. By using a common unit of reference instead of different reference systems, automatic coordination of the integrated circuit and the design layout may only have to be performed once instead of multiple times for multiple tools. The image coordinates of the detected anomaly may be transformed to the coordinates of a common reference system by vectorizing the image into closed polygons, matching the polygons in the design layout with the polygons in the image and then aligning the image of the detected anomaly with the design layout of the image. Upon alignment, the location and orientation of the polygons in the image corresponding to the polygons matched in the design layout are defined in terms of the coordinates of the design layout. Further, upon alignment, the location of the defect in the image of the detected anomaly is re-identified thereby enabling the location of the detected anomaly to be expressed in terms of the coordinates of a common reference system, such as the design layout.

Upon aligning the image of the detected anomaly with the design layout of the image, positional correspondence between the image of the integrated circuit and the design layout may be maintained. Additional anomalies may be detected by comparing a vector representation of a physical object in the integrated circuit with a vector representation of a corresponding physical object in the design layout. If there are any differences between the two vector representations, then an anomaly may be detected. Further, since the image of the detected anomaly is aligned with the design layout of the image, the location of the detected anomaly is described in terms of the design layout (example of a common reference system).

Furthermore, since the detected anomalies are described in terms of a common reference system, the detected anomalies may be mapped onto related design impact data such as a netlist trace to thereby more accurately assess the impact of the detected anomaly. Further, values of a physical object at the coordinates of the detected anomaly, as well as the surrounding physical objects of the detected anomaly, may be received from a database. A simulation may then be performed of the integrated circuit using these values to thereby more accurately assess the impact of the detected anomaly.

In one embodiment of the present invention, a method for assessing the impact of anomalies comprises the step of retrieving an image of a physical device. The method may further comprise obtaining a design layout of the image. The method may further comprise registering the image of the physical device and the design layout of the image in a common frame of reference. The step of registering the image of the physical device and the design layout of the image in a common frame of reference may comprise vectorizing the image of the physical device into closed polygons. The step of registering the image of the physical device and the design layout of the image in a common frame of reference may further comprise matching polygons in the image with polygons in the design layout. The step of registering the image of the physical device and the design layout of the image in a common frame of reference may further comprise aligning the image with the design layout of the image using the matched polygons.

The foregoing has outlined rather generally the features and technical advantages of one or more embodiments of the present invention in order that the detailed description of the invention that follows may be better understood. Additional features and advantages of the invention will be described hereinafter which may form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

Although the present invention is described with reference to a semiconductor or nanotechnology application, it is noted that the principles of the present invention may be applied to other applications, such as automotive, biological, chemical, and astronomical applications, where anomalies need to be more accurately assessed. It is further noted that although the present invention is described with reference to an integrated circuit that the principles of the present invention may be applied to other devices such as devices that encompass mechanical operation, hybrid computing techniques or optical hardware. It is further noted that embodiments applying the principles of the present invention to such applications and devices would fall within the scope of the present invention.

Figure 1:
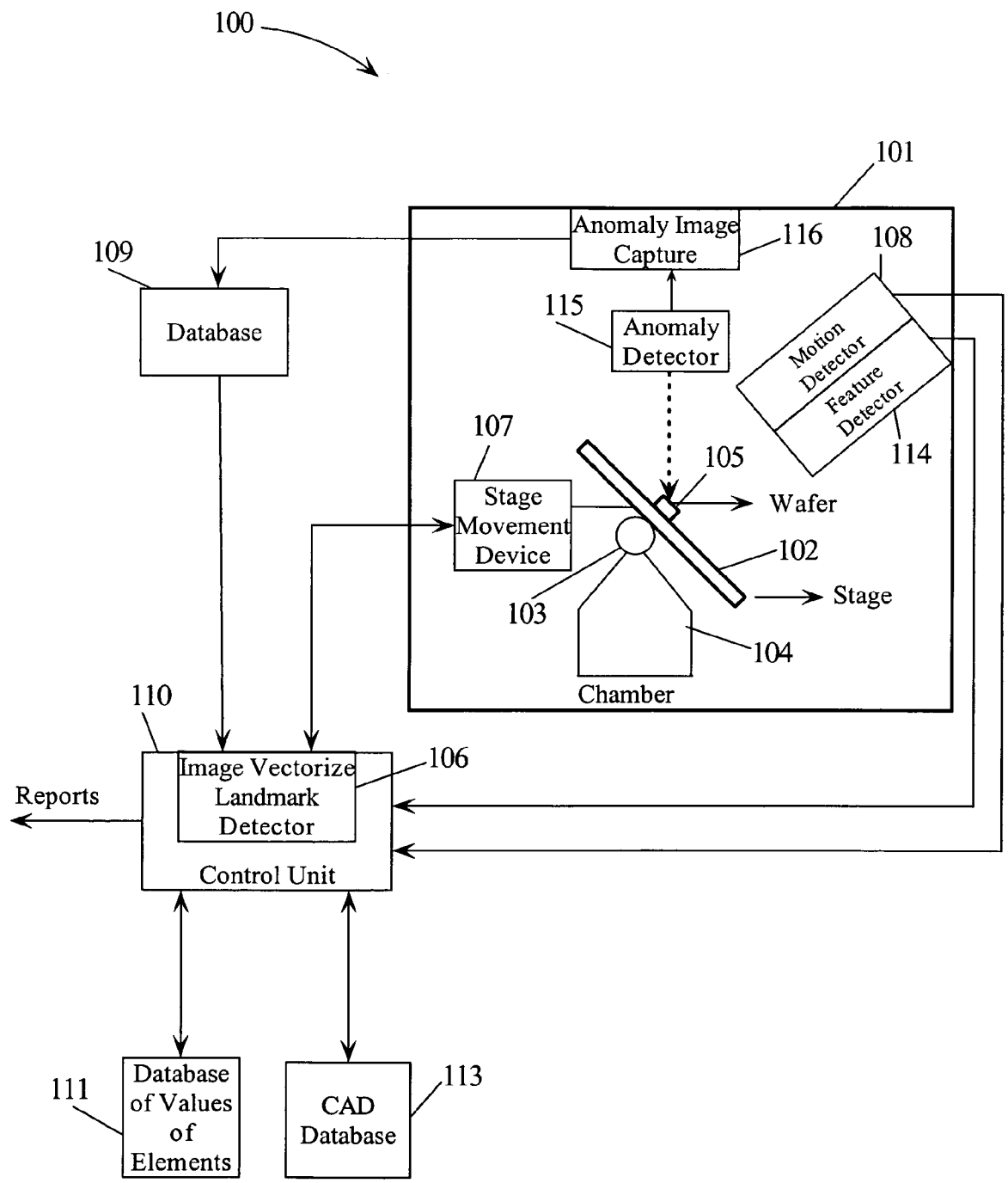
FIG. 1 illustrates a system for accurately assessing the impact of anomalies on integrated circuits in accordance with an embodiment of the present invention.

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art FIG. 1—High Level Diagram of System for Accurately Assessing the Impact of Anomalies on Integrated Circuits FIG. 1 is a high level diagram of an embodiment of a system 100 for accurately assessing the impact of anomalies on integrated circuits in accordance with an embodiment of the present invention. Referring to FIG. 1, system 100 may comprise a chamber 101 that includes a movable stage 102 or movable detectors. Movable stage 102 may include a support member 103 and a motion mechanism 104. A wafer 105 may be placed on rotating stage 102 where the dies (integrated circuits) on wafer 105 may be inspected or analyzed to determine the locations of anomalies in particular integrated circuits as discussed further below. Chamber 101 may further include an anomaly detector 115 configured to detect anomalies on a particular integrated circuit of wafer 105. An image of the detected anomaly may be captured by anomaly image capture unit 116. Anomaly image capture unit 116 may further be configured to capture information related to the captured image such as the manner in which the image was captured, e.g., electron beam, the particular step in the semiconductor process in which the image was captured, etc. Such information may be placed in the header of the file of the captured image. Chamber 101 may further include a movement device 107 configured to move rotating stage 102 or detector 105. Chamber 101 may further include a motion detector 108 configured to detect movement of wafer 105. Chamber 101 may further include a feature detector 114 configured to detect features, e.g., particular transistor, on the integrated circuit. It is noted that chamber 101 may include other elements which were not depicted for the sake of brevity as well as for ease of illustration. It is further noted that chamber 101 may not include some of the elements depicted such as a tool, e.g., anomaly detector 115, configured to detect an anomaly in the integrated circuit. In such an embodiment, image capture unit 116 may capture an image of a section or the entire integrated circuit that does not include an anomaly initially detected.

Referring to FIG. 1, anomaly image capture unit 116 may be configured to output the captured image (including data related to the captured image) to database 109. Database 109 may further be configured to store data, e.g., resistor values, lengths of vias, associated with the captured image. It is noted that even though FIG. 1 illustrates a single database 109 that system 100 may include multiple databases storing separate manufacturing data. It is further noted that a separate database may be used to store data associated with the captured image.

Database 109 may be coupled to a control unit 110 where control unit 110 is configured to automatically align the integrated circuit and the design layout of the integrated circuit to more accurately assess the impact of anomalies as described in greater detail further below. Align may refer to finding the correspondence between the content of the images and to register the images together or to a common frame of reference. A more detail description of control unit 110 is described below in association with FIG. 2. Control unit 110 may include an image vectorizer/landmark detector 106 configured to vectorize the captured image (referring to creating a vector representation of an image) as described in greater detail in association with FIG. 3. Image vectorizer/landmark detector 106 may further be configured to detect two or more landmarks in the captured image. Landmarks, referred to herein, may refer to a position on the integrated circuit whose appearance is stable or constant across moderate changes in imaging conditions. A more detail description of using landmarks to align the integrated circuit with a design layout is described further below in association with FIG. 3.

Control unit 110 may be coupled to a database 111 storing values of elements located at particular coordinates in the design layout of the integrated circuit, i.e., the design drawing of the integrated circuit. Elements may include any component of the integrated circuit such as resistors, transistors, capacitors, wiring, vias, etc.

Control unit 110 may further be coupled to a Computer Aided Design (CAD) database 113 configured to store the design layouts of integrated circuits on wafer 105 in CAD format.

Control unit 110 may further be coupled to stage movement device 107 to control movement of stage 102. Further, control unit 110 may be coupled to motion detector 108 in order to maintain correspondence between the design layout and the position of the integrated circuit on stage 102 by tracking the movement of stage 102 as described in further detail further below.

Control unit 110 may further be configured to generate reports that describe the results of the simulation of the integrated circuit using the values of the elements in the detected anomaly area from database 111 to assess the impact of the anomaly. The reports may also include reporting the top anomalies or those anomalies that have the greatest impact on surrounding circuitry.

It is noted that system 100, as depicted in FIG. 1, is not to be limited in scope to any one particular embodiment.

Figure 2:
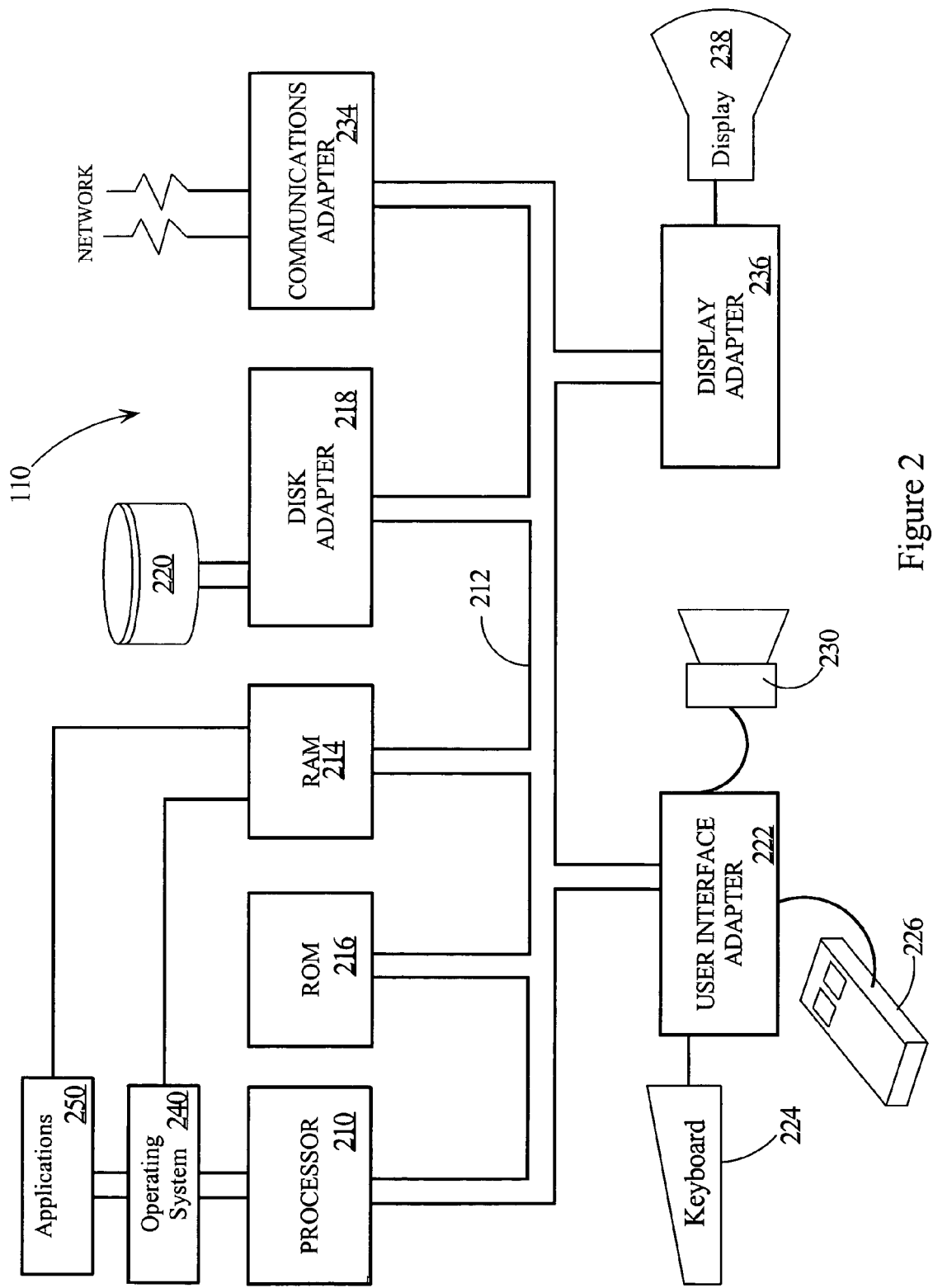
FIG. 2 illustrates an embodiment of the present invention of a control unit in the system.

FIG. 2—Control Unit

Figure 3:
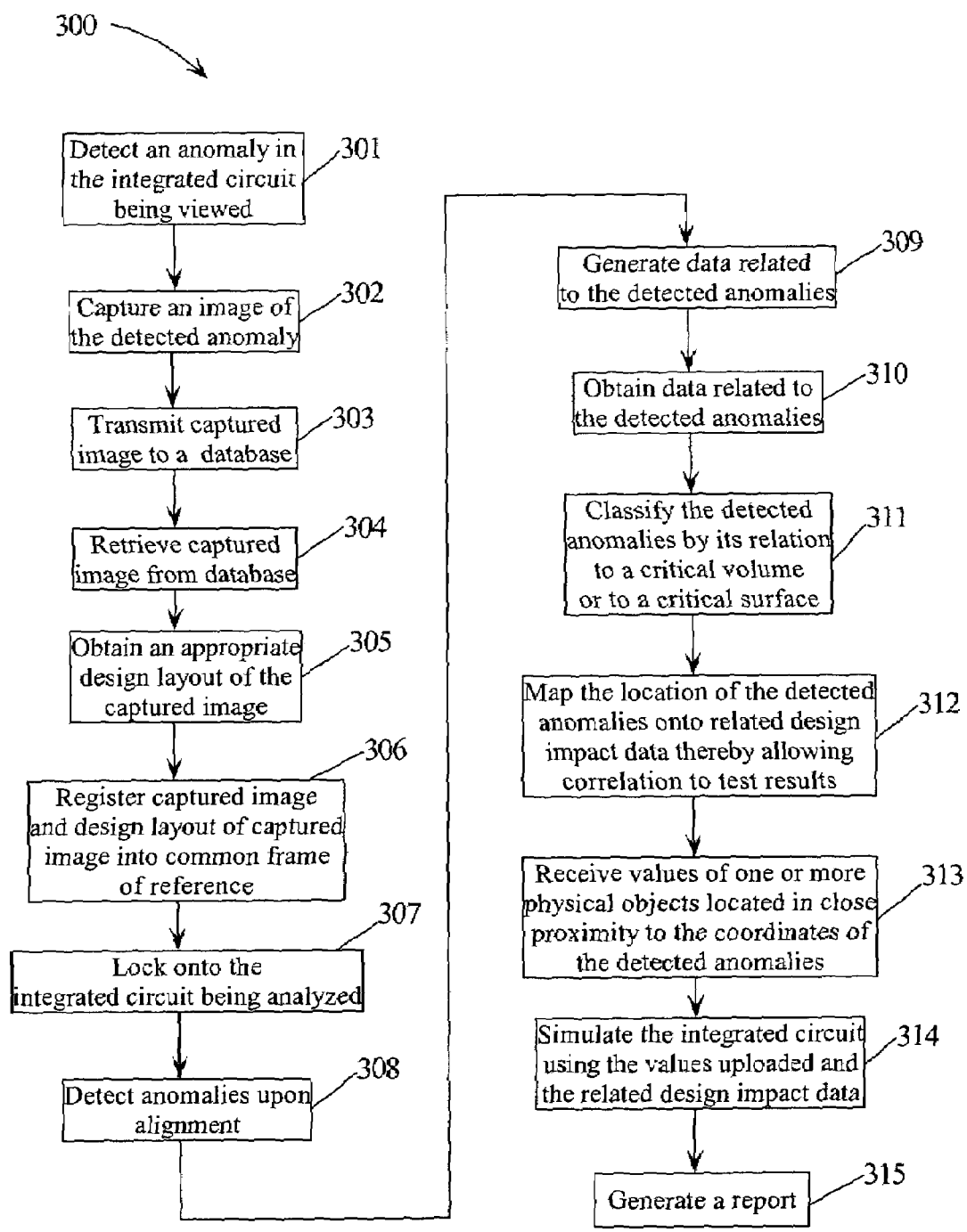
FIG. 3 is a flowchart of a method for automatically aligning the integrated circuit and the design layout of the integrated circuit to more accurately assess the impact of anomalies on the integrated circuit in accordance with an embodiment of the present invention.
Figure 9:
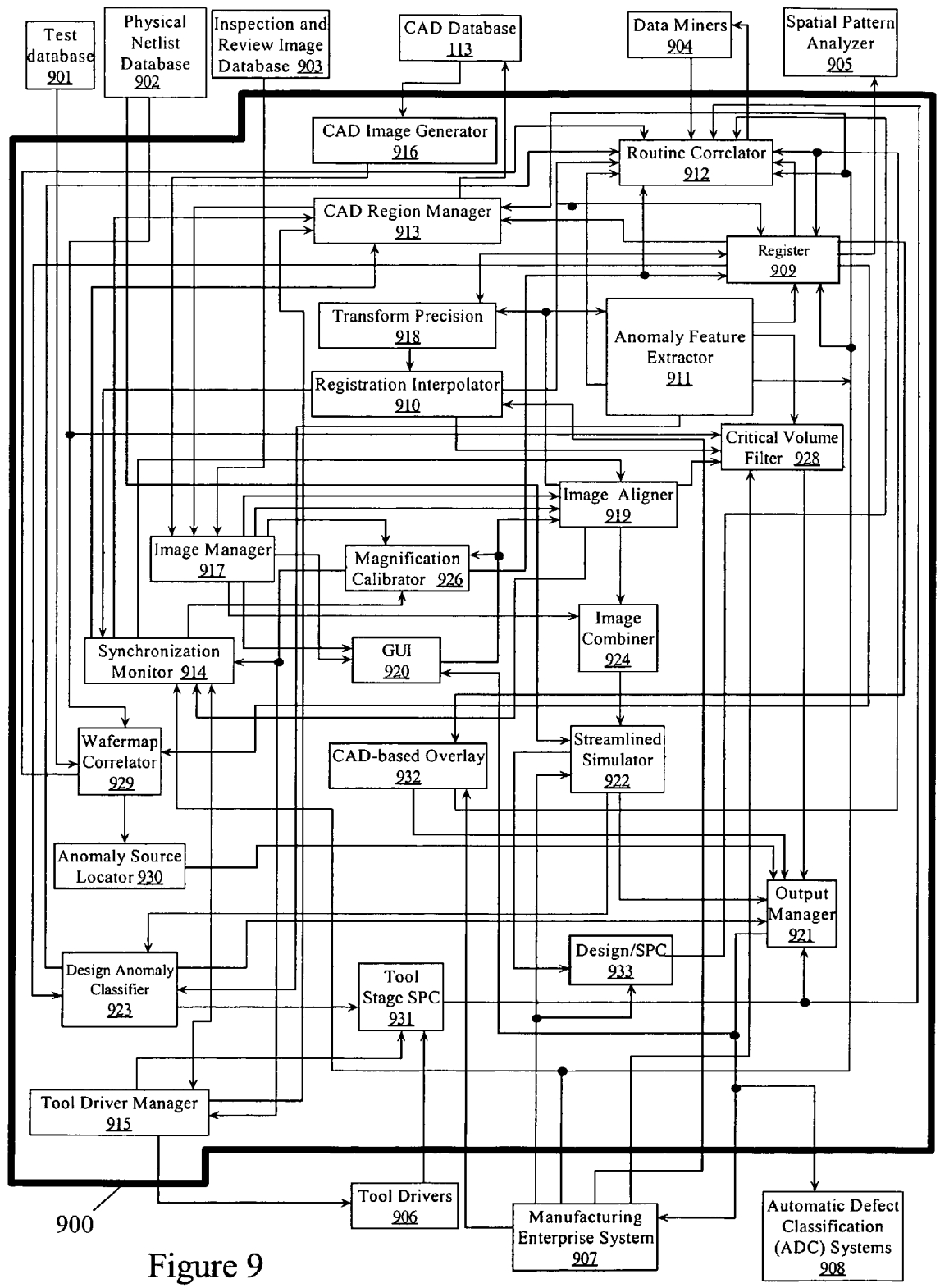
FIG. 9 illustrates a software system comprising software components used to automatically align an integrated circuit and the design layout of the integrated circuit to more accurately assess the impact of anomalies on the integrated circuit in accordance with an embodiment of the present invention.

FIG. 2 illustrates a typical hardware configuration of control unit 110 (FIG. 1) which is representative of a hardware environment for practicing the present invention. Referring to FIG. 2, control unit 110 may have a processor 210 coupled to various other components by system bus 212. An operating system 240 may run on processor 210 and provide control and coordinate the functions of the various components of FIG. 2. An application 250 in accordance with the principles of the present invention may run in conjunction with operating system 240 and provide calls to operating system 240 where the calls implement the various functions or services to be performed by application 250. Application 250 may include, for example, a software appliance configured to automatically align the integrated circuit and the design layout of the integrated circuit to more accurately assess the impact of anomalies as discussed further below in association with FIGS. 3 and 9. It is noted that application 250 may represent multiple simultaneous appliances. FIG. 3 is a high-level flowchart of a method for automatically aligning the integrated circuit and the design layout of the integrated circuit to more accurately assess the impact of anomalies. FIG. 9 is a software system component diagram of the program for automatically aligning the integrated circuit and the design layout of the integrated circuit to more accurately assess the impact of anomalies. It is noted for clarity that application 250 may include the programs for all the software components described in FIG. 9. It is further noted that processor 210 has circuitry configured to execute the instructions of application 250.

Read only memory (ROM) 216 may be coupled to system bus 212 and include a basic input/output system ("BIOS") that controls certain basic functions of control unit 110. Random access memory (RAM) 214 and disk adapter 218 may also be coupled to system bus 212. It should be noted that software components including operating system 240 and application 250 may be loaded into RAM 214 which may be control unit's 110 main memory. Disk adapter 218 may be an integrated drive electronics ("IDE") adapter that communicates with a disk unit 220, e.g., disk drive. It is noted that the application configured to automatically align the integrated circuit and the design layout of the integrated circuit to more accurately assess the impact of anomalies, as discussed further below in association with FIGS. 3 and 9, may reside in disk unit 220 or in application 250.

Returning to FIG. 2, communications adapter 234 may also be coupled to system bus 212. Communications adapter 234 may interconnect bus 212 with an outside network enabling control unit 110 to communicate with the devices coupled to control unit 110 as illustrated in FIG. 1. Input/Output devices may also be connected to system bus 212 via a user interface adapter 222 and a display adapter 236. Keyboard 224, mouse 226 and speaker 230 may all be interconnected to bus 212 through user interface adapter 222. Event data may be inputted to control unit 110 through any of these devices. A display monitor 238 may be connected to system bus 212 by display adapter 236. In this manner, a user is capable of inputting to control unit 110 through keyboard 224 or mouse 226 and receiving output from control unit 110 via display 238 or speaker 230.

Implementations of the invention include implementations as a computer system programmed to execute the method or methods described herein, and as a computer program product. According to the computer system implementations, sets of instructions for executing the method or methods may be resident in the random access memory 214 of one or more computer systems configured generally as described above. Until required by control unit 110, the set of instructions may be stored as a computer program product in another computer memory, for example, in disk unit 220. Furthermore, the computer program product may also be stored at another computer and transmitted when desired to the user's workstation by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change.

FIG. 3—Flowchart of a Method for Automatically Aligning the Integrated Circuit and the Design Layout of the Integrated Circuit to more Accurately Assess the Impact of Anomalies FIG. 3 is a flowchart of one embodiment of the present invention of a method 300 for automatically aligning the integrated circuit and the design layout of the integrated circuit to more accurately assess the impact of anomalies.

Referring to FIG. 3, in conjunction with FIG. 1, in step 301, anomaly detector 115 detects an anomaly in the integrated circuit currently being viewed. Anomaly detector 115 may be a Scanning Electron Microscope (SEM) configured to scan an electron or ion beam over the surface of the integrated circuit. In step 302, anomaly image capture unit 116 captures an image of the detected anomaly. The captured image may be an image of a section or the entire integrated circuit that includes the detected anomaly. In one embodiment of the present invention, system 100 may not include a tool, e.g., anomaly detector 115, configured to detect an anomaly in the integrated circuit. In such an embodiment, image capture unit 116 may capture an image of a section or the entire integrated circuit that does not include an anomaly initially detected. Anomalies in such an image may later be detected using the process described below. In one embodiment, image capture unit 116 may, in addition to capturing an image of a section or the entire integrated circuit, capture information related to the captured image such as the manner in which the image was captured, e.g., electron beam, the particular step in the semiconductor process in which the image was captured, etc. Such information may be placed in the header of the file of the captured image.

In step 303, anomaly/landmark detector 106 transmits the captured image, including associated data, to database 109 which is later obtained and transformed into a vector representation by control unit 110. In step 304, control unit 110 retrieves the captured image from database 109.

In step 305, control unit 110 obtains an appropriate design layout (such as the design layout for the interconnect layer of the captured image) from CAD database 113 of the captured image. The obtained design layout may also contain features and landmarks.

In step 306, control unit 110 registers the captured image and the design layout of the captured image into a common reference system, e.g., design layout. That is, control unit 110 transforms the image coordinates of the captured image (including any detected anomalies) to the coordinates of a common frame of reference, such as the design layout obtained in step 304. It is noted for clarity that although the description below describes the common frame of reference as being the design layout that the common frame of reference may be any type of reference. It is further noted that the use of the design layout as a common frame of reference is illustrative and that the principles of the present invention are not to be limited as such. By using a common unit of reference instead of different reference systems, automatic coordination of the integrated circuit and the design layout may only have to be performed once instead of multiple times for multiple tools. Step 306 may comprise sub-steps as illustrated in FIG. 4.

Figure 4:
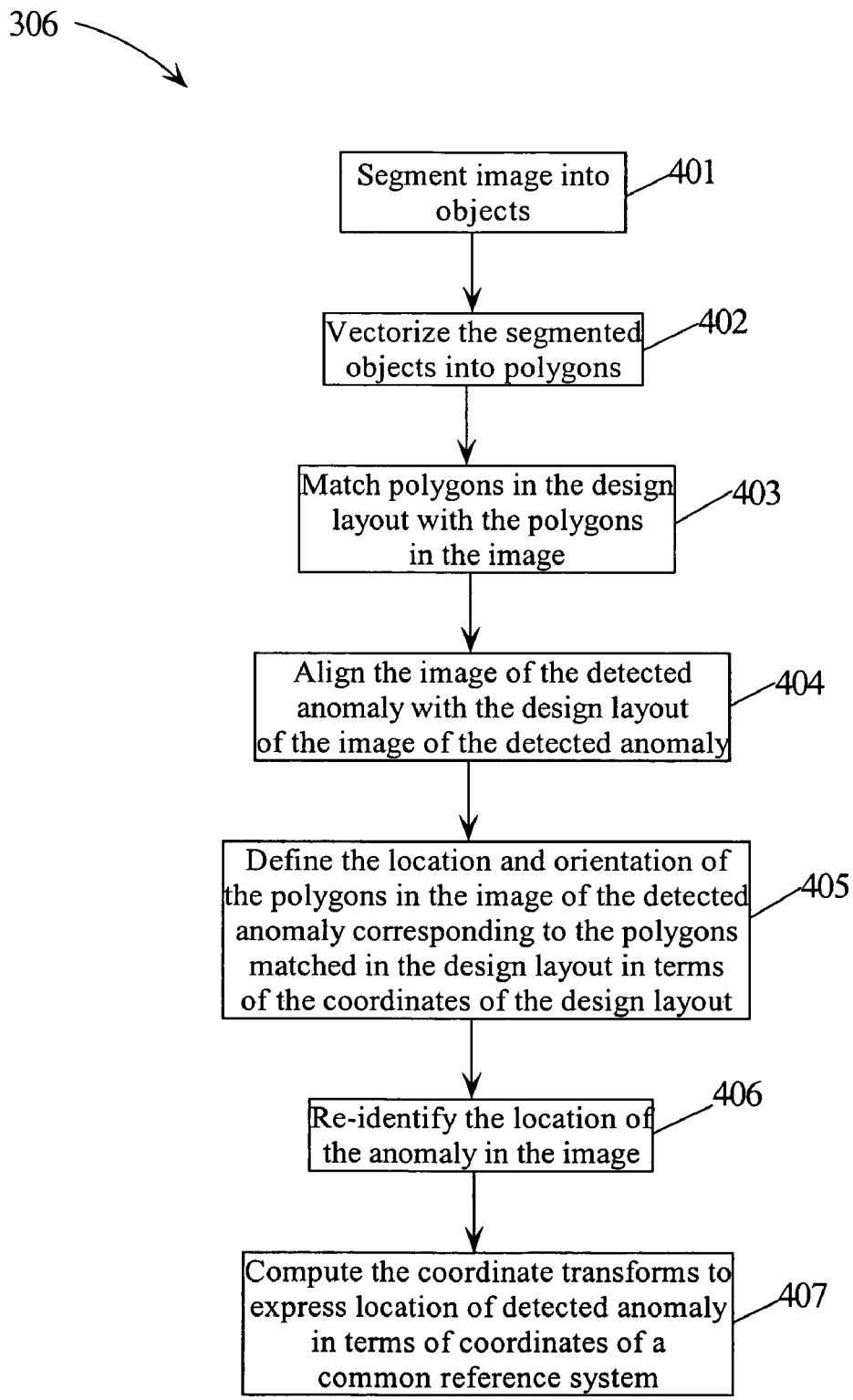
FIG. 4 is a flowchart of the sub-step of registering the image of the physical device and the design layout of the image in a common frame of reference in accordance with an embodiment of the present invention.
Figure 5:
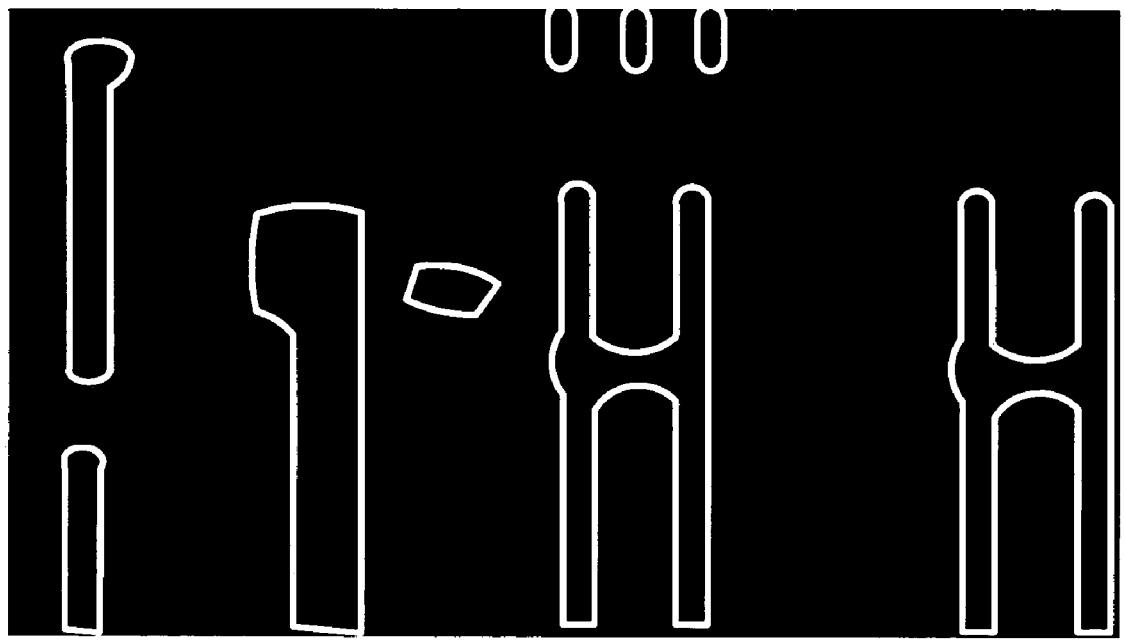
FIG. 5 illustrates an image before and after segmentation in accordance with an embodiment of the present invention.
Figure 5:
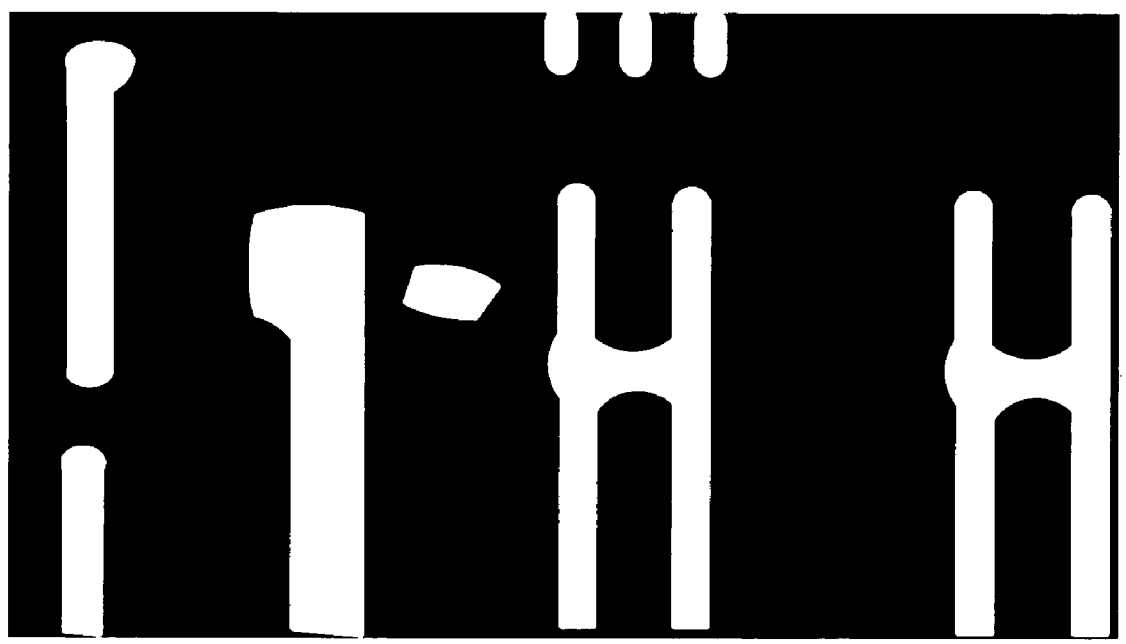

FIG. 4 illustrates one embodiment of the present invention of control unit 110 determining the coordinates of the captured image (including any detected anomalies) in terms of the coordinates of a common frame of reference, such as design coordinates. Referring to FIG. 4, in conjunction with FIG. 1, in step 401, control unit 110 segments the image (including any detected anomalies) into objects. Image segmentation may group pixels in the image according to similarities in color, texture, grayscale, hue, saturation and motion. An illustration of an image before and after segmentation in accordance with an embodiment of the present invention is provided in FIG. 5. Referring to FIG. 5, FIG. 5 illustrates segmenting an image into a background object shown in black and a number of foreground objects shown in white. It is noted for clarity that the picture on the left in FIG. 5 depicts an image prior to segmentation and that the picture on the right in FIG. 5 depicts the image after segmentation. The output of segmentation is a list of objects found, where each object may reference a list of pixels that comprise the region belonging to the object. Segmentation may be implemented by algorithms that use wavelet transforms, region growing, region merging and thresholding. In an alternative embodiment, the segmentation step may be replaced with the step of aligning a bit map representation of the captured image with a bit map representation of the design layout where there exists a maximum correspondence between the two bit map representations. For example, an alignment may be achieved where there exists a highest number of correlated dark spots and correlated white spots between the two bit map representations.

Figure 6:
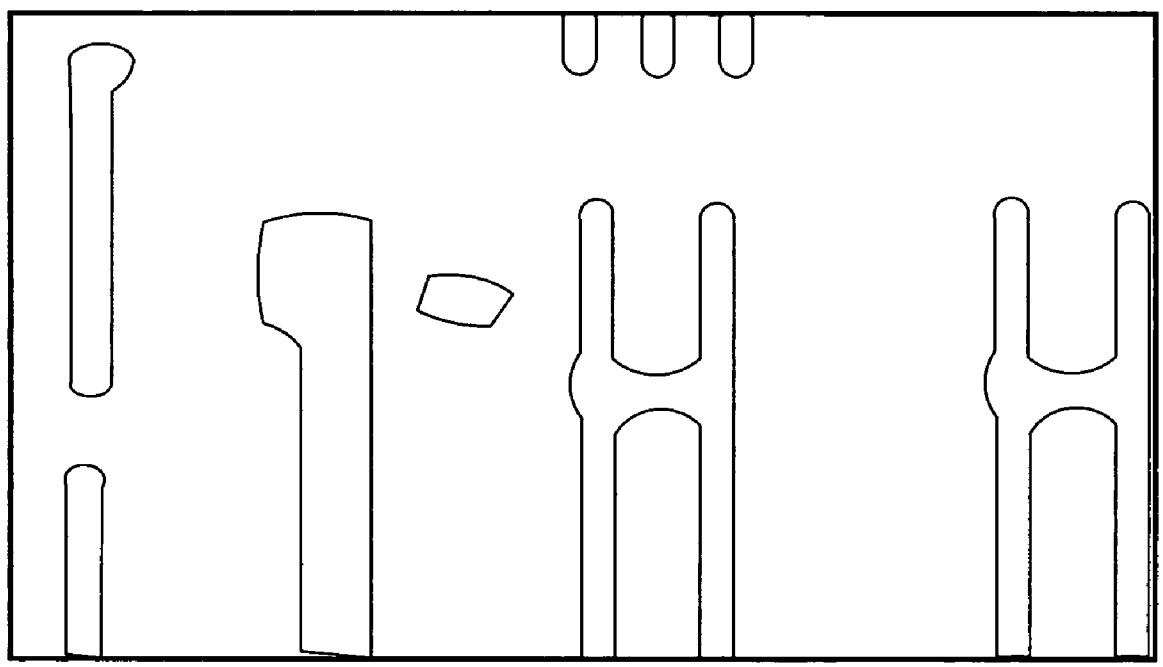
FIG. 6 illustrates vectorizing a segmented image in accordance with an embodiment of the present invention.

In step 402, control unit 110 vectorizes the segmented objects into closed polygons. That is, control unit 110 may determine the set of vectors that form the boundary of a segmented object and connect these vectors into loops that form polygons as illustrated in FIG. 6. FIG. 6 illustrates an embodiment of the present invention of vectorizing the segmented image of FIG. 5. It is noted that edges that correspond to the edge of an image are marked so that they are used for matching the topology in the design layout. Edges not associated with a feature, landmark or segment may be systematically eliminated. In the alternative embodiment of aligning the bit map representation of the captured image with the bit map representation of the design layout in step 401, step 402 may include vectorizing the bit map representation of the captured image.

Figure 7:
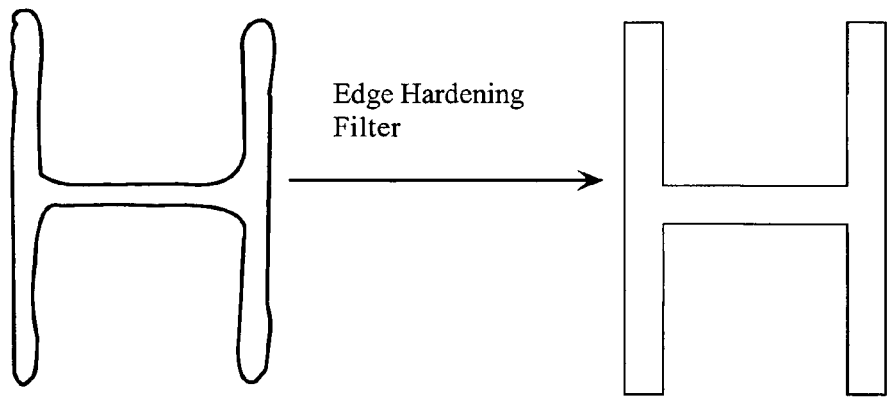
FIG. 7 illustrates an edge filter squaring the major concave and convex corners of image-based polygons to approximate the inverse of the lithographic process in accordance with an embodiment of the present invention.
Figure 8:
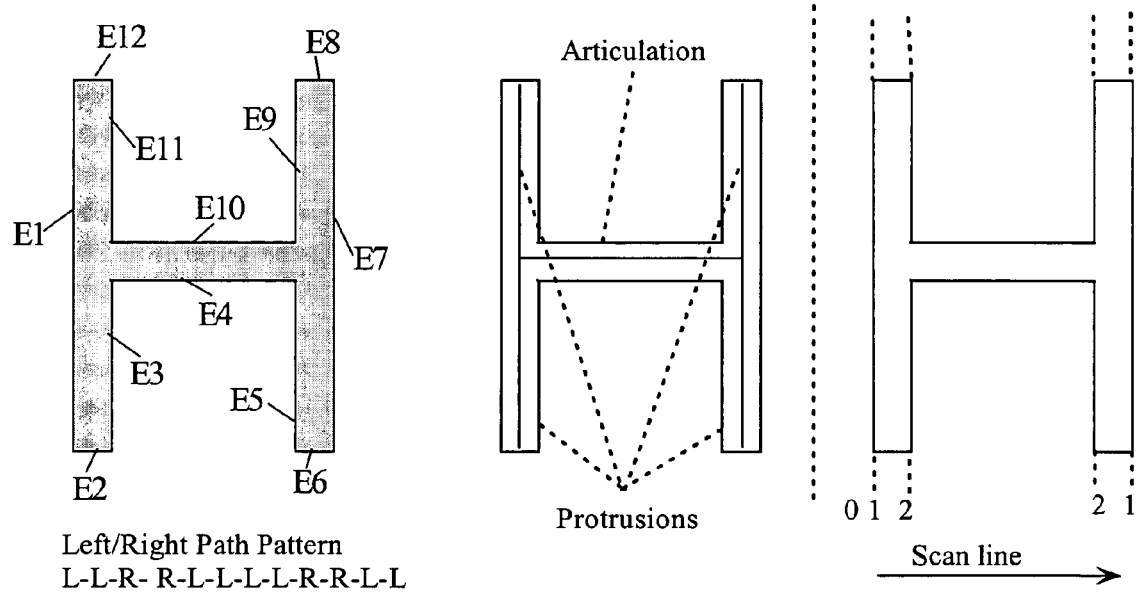
FIG. 8 illustrates the steps involved in determining the correspondence between the polygons in the design layout and in the image in accordance with an embodiment of the present invention.

In step 403, control unit 110 matches the polygons in the design layout with the polygons in the image. That is, control unit 110 determines the correspondence between the polygons in the design layout and in the image. Control unit 110 may use topology to match polygons from the image of the detected anomaly against the polygons from the design layout. It is noted that the design layout of the image of the detected anomaly may be stored in database 113 in a vector format. It is further noted that the edges of the polygons of the image of the detected anomaly may not be uniform due to the effect of the lithographic process. An edge filter may be used to straighten these edges thereby allowing the matching of the polygons in the image to the corresponding polygons in the design layout. For example, an edge filter may square the major concave and convex corners of image-based polygons to approximate the inverse of the lithographic process as illustrated in FIG. 7. In another example, an edge filter may round the polygons from the design layout to approximate the effect of the lithographic process. The polygons in the image of the detected anomaly may be matched with the polygons in the design layout by encoding shape features as a sequence of convex and concave shapes and then search for matching sequences. Upon searching for matching sequences, the width of the polygons may be made zero thereby forming lines. A search in the design layout and in the image may then be performed for matching line patterns. After matching the line patterns, the cross sections of the design layout that correspond to cross sections in the polygonized image may be identified using a scan line matching algorithm. These steps are illustrated in FIG. 8.

In step 404, control unit 110 aligns the image captured by anomaly image capture 116 with the design layout of the captured image. In one embodiment, control unit 110 may align the captured image with the design layout of the image by identifying two or more landmarks in the image using detector 106. As stated above, landmarks may refer to a position on the integrated circuit whose appearance is stable or constant across moderate changes in imaging conditions. An example of a landmark may be a corner of a die or a large alignment mark used for Scanning Electron Microscope (SEM) metrology that includes a unique series of juxtaposed boxes. In another embodiment, control unit 110 may be configured to align the captured image with the design layout of the captured image by pattern matching which includes matching each vector of the captured image with each vector of the design layout of the image. If there is a sufficient match between the vectors of the captured image with the vectors of the design layout of the image, then the captured image may be aligned with the design layout of the image.

In step 405, control unit 110 defines the location and orientation of the polygons in the captured image corresponding to the polygons matched in the design layout in terms of the coordinates of the common frame of reference, e.g., design layout.

In step 406, control unit 110 re-identifies the location of the detected anomaly in the image. Control unit 110 may re-identify the location of the anomaly in the image as the actual location of the anomaly within the image may still be in error because of uncertainty over the exact location of the anomaly in the image. The anomaly should be located in the center of the image when detected by existing metrology equipment but may deviate. In one embodiment, control unit 110 may re-identify the location of the anomaly in the image of the detected anomaly by comparing a vector representation of a particular physical object of an image being viewed with the vector representation of the corresponding physical object obtained from the design layout. Anomalies may then be detected where there is a difference between the vector representations. Since the vector representation of the physical object of the integrated circuit obtained from the design layout is error free, the only error introduced in the above-described process is the creation of the vector representation of the physical object being viewed. It is noted that in the embodiment of system 100 not including an anomaly detector 115 that step 406 may not be necessary to be executed. As stated above, in such an embodiment, image capture unit 116 may capture an image that does not include an anomaly initially detected.

In step 407, control unit 110 computes the coordinate transform to express the location of the detected anomaly in terms of the coordinates of a common reference system, such as the design layout. The coordinates of the detected anomaly in the image may be transformed into the coordinates of the common reference system since the image is aligned with the design layout. That is, there is a correlation between points in the image to points in the design layout since the image is aligned with the design layout. It is noted that in the embodiment of system 100 not including an anomaly detector 115 that step 407 may not be necessary to be executed. As stated above, in such an embodiment, image capture unit 116 may capture an image that does not include an anomaly initially detected.

Returning to step 306 of FIG. 3, in the case of there not being an image of the detected anomaly, control unit 110 may determine the coordinates of the detected anomaly in terms of CAD coordinates (example of a common frame of reference) by computing an affine transformation between other images of the integrated circuit being analyzed and the design layout and applying this transform to the coordinates of the detected anomaly to thereby generate the coordinates of the design layout.

In the case of image vectorizer/landmark detector 106 determining the coordinates of the detected anomaly by matching the major features, e.g., processor, memory, in the image of the integrated circuit with the design layout by using a Scanning Electron Microscope (SEM) or an optical microscope image, control unit 110 may determine the coordinates of the detected anomaly in terms of CAD coordinates (example of a common frame of reference) by performing an alignment transform to match the image of the detected anomaly to the design layout. An alignment transform may refer to the distortion, e.g., rotation, magnification, affine transforms, applied to one object, e.g., image, that is made to achieve alignment of another object, e.g., design layout. Instead of the alignment transform, control unit 110 may redetect the defect by a difference/subtraction algorithm thereby placing the detected anomaly with the field of view and use the center of the field of view as the design coordinates of the detected anomaly. The difference/subtraction algorithm may be configured to remove the features in the integrated circuit image that also appear in the design layout. The remaining features in the integrated circuit image may be defined to be "anomalies."

Once the detected anomaly is referenced in the common coordinate system, control unit 110 may determine if the detected anomaly is located in a designated critical area. A critical area may refer to an area of the integrated circuit critical to the operation of the integrated circuit. There are two-dimensional critical areas and three-dimensional critical volumes. A two-dimensional critical area may refer to an area on the surface of wafer 105 critical to the operation of the features, e.g., transistors, located on the plane of wafer 105. If an area on the surface of wafer 105 is not critical to the operation of the features located on the plane of wafer 105, then that area may be critical to the joining of other surfaces, features or sub-components. For example, a small particle on a wide metal line that would not interfere with the conduction of the metal line may not be critical for the metal line assembly. However, the particle may interfere with the conductance of a connection to that metal line if it is intended that a contact or via will make the connection to the metal line at that particle's position. The particle may then be at a critical position when a three-dimensional design is comprehended. This may be referred to as a three-dimensional critical volume.

In step 307, control unit 110 locks onto the integrated circuit after two or more landmarks in the integrated circuit are identified. Locking refers to maintaining the positional correspondence between the integrated circuit and the design layout selected in step 305. Locking may be achieved by motion detector 108 detecting movements of stage 102 and transmitting that information to control unit 110. Control unit 110 may, in turn, cause the design layout appearing on display 238 (FIG. 2) to be moved accordingly so that there is maintained a positional correspondence between the integrated circuit and the design layout selected in step 305.

Locking may further be achieved by detecting movement of the integrated circuit via feature detector 114 configured to detect movement of a particular feature, e.g., particular transistor in the integrated circuit. This may be referred to herein as "feature tracking."

In step 308, control unit 110 detects additional anomalies (or new anomalies if there were no initially detected anomalies) in the integrated circuit being viewed upon alignment of the image with the design layout of the image. For example, control unit 110 may detect additional anomalies as the integrated circuit is moved upon movements of stage 102. In one embodiment, control unit 110 may detect additional anomalies (or new anomalies if there were no initially detected anomalies) by comparing the vector representation of a particular physical object of an image being viewed with the vector representation of the corresponding physical object obtained from the design layout. As stated above, image vectorizer/landmark detector 106 may be configured to vectorize a particular object, e.g., an image of a section of an integrated circuit currently being viewed. Further, the design layout may already be in a vector representation format. Anomalies may then be detected where there is a difference between the vector representations. Since the vector representation of the physical object of the integrated circuit obtained from the design layout may be error free, the only error introduced in the above-described process may be the creation of the vector representation of the physical object being viewed.

In step 309, control unit 110 generates data related to the detected anomalies (referring to anomalies detected in steps 301 and 308). In one embodiment, control unit 110 may classify the detected anomaly by type (for example, particle, scratch, buried layer), and other characteristics (for example, the degree of overlay of the anomaly to the printed feature, size, and orientation to the design).

In step 310, control unit 110 obtains additional data, if necessary, related to the detected anomalies (referring to anomalies detected in steps 301 and 308) in order to further understand the impact of the detected anomalies. For example, control unit 110 may obtain data, such as material properties, from database 111.

In step 311, control unit 110 classifies the detected anomalies by its relation to a critical volume (three-dimensional area) or a critical surface (two-dimensional area) in the design layout. Classifying the detected anomalies by its relation to a critical volume or a critical surface refers to determining if the detected anomalies are located in a designated critical area as described above.

In step 312, control unit 110 maps the location, e.g., design coordinates, of the detected anomalies onto related design impact data, such as a netlist trace, allowing correlation to test results, such as scan trace failures. A netlist may refer to a list of numbered routes and function names. An integrated circuit layout may contain groups of features, e.g., transistors, that relate to a particular electronic circuit element, e.g., processor. The groups are named and the signal routings between groups may be numbered. The netlist may provide information on the intended electrical connectivity between physical points in the integrated circuit layout. A netlist trace may refer to a section of the integrated circuit layout between two nodes in the netlist. A scan circuit may be inserted in the integrated circuit in order to test the functionality of the integrated circuit. If the scan circuitry fails, then a route or line segment through the physical layout may be identified. A trace of the scan circuitry that fails ("scan trace failures") does not provide the information as to what layer of the integrated circuit the scan circuit failed. By mapping the anomaly locations onto the netlist locations, the circuit layout location becomes known and hence the layer of the integrated circuit the scan circuit failed becomes known. By mapping the anomaly locations onto the netlist locations, scan traces that may fail due to the presence of an anomaly may be identified.

In step 313, control unit 110 receives the values of one or more physical objects in close proximity to the coordinates of the detected anomalies from database 111. That is, control unit 110 receives the values of one or more physical objects located at or surrounding the coordinates of a detected anomaly. For example, a resistor may be located at the coordinates of the detected anomaly. Consequently, the value of that resistor may be received from database 111. Furthermore, the values of the objects, e.g., transistors,; surrounding the detected anomaly may be received to thereby more accurately assess the impact of the detected anomaly as discussed below.

In step 314, control unit 110 simulates the integrated circuit using the values received in step 313 and the related design impact data of step 312 to thereby assess the impact of the detected anomalies. In one embodiment, control unit 110 may assess the impact of a detected anomaly in multiple layers or in three-dimensions. Assessing the impact of a detected anomaly in three-dimensions may refer to assessing the impact of the detected anomaly in a three-dimensional volume surrounding the detected anomaly. In one embodiment, control unit 110 may assess the impact of a detected anomaly in a confined area using a software function, referred to herein as the "streamlined simulator." The streamlined simulator may be configured to simulate the functioning of a portion of the integrated circuit containing the detected anomaly.

In step 315, control unit 110 generates a report that includes the results of the simulation in step 314. The report may also include reporting the top anomalies or those anomalies that have the greatest impact on surrounding circuitry.

It is noted that method 300 may include other and/or additional steps that, for clarity, are not depicted. It is further noted that method 300 may be executed in a different order presented and that the order presented in the discussion of FIG. 3 is illustrative. It is further noted that certain steps in method 300 may be executed in a substantially simultaneous manner.

A software system component diagram of the program for automatically aligning the integrated circuit and the design layout of the integrated circuit to more accurately assess the impact of anomalies is discussed below in association with FIG. 9.

FIG. 9—Software System Component Diagram

FIG. 9 illustrates an embodiment of the present invention of a diagram of a software system 900 comprising software components used to automatically align the integrated circuit and the design layout of the integrated circuit to more accurately assess the impact of anomalies.

Referring to FIG. 9, in conjunction with FIG. 1, software system 900 receives a set of inputs, such as, a test database 901, a physical netlist database 902, an inspection and review image database 903, CAD database 113, data miners 904, a spatial pattern analyzer 905 and tool drivers 906, to generate a set of outputs that are transmitted to a manufacturing enterprise system 907 and an Automatic Defect Classification (ADC) system 908. These components will be discussed in further detail below.

Test database 901 may contain the results from testing the final assembly, i.e., the results from testing the fabricated integrated circuits on wafer 105. Physical netlist database 902 may contain netlists of integrated circuits which, as described above, may refer to a list of numbered routes and function names. Inspection and review image database 903 may refer to images of anomalies detected by inspection tools that are stored in database 903. Data miners 904 may refer to applications that identify patterns and relationships in data including data related to detected anomalies as well as netlists, wafer maps, process control parameters and inline metrology data using statistical techniques and construct models to predict future results. Future results may include the outcomes from the next step in the manufacturing process or the final device performance. Spatial pattern analyzer 905 may refer to an application that groups anomalies into signatures that may then be classified into process events. Signatures may refer to the patterns of the anomalies located on the die. For example, a greater number of anomalies located at the perimeter of the die than located at the interior of the die may be a signature of a Chemical Mechanical Polishing (CMP) problem. In another example, if the pattern of the anomalies follows a circular pattern, then there may be a problem with the spin coating process. Tool drivers 906 may refer to software that assists in the control of robotic elements used in the fabrication of semiconductors. Manufacturing enterprise system 907 may refer to computer systems focused on the planning and control of manufacturing operations and parts scheduling in the fabrication of semiconductor devices. ADC system 908 may refer to external anomaly classification systems that group data pertaining to the identified anomalies into classes that can be related to the cause of the anomaly by the use of statistics such as regression correlation.

Referring to FIG. 9, software system 900 may include a CAD registrar 909 configured to store all data that has been registered in the common frame of reference, i.e., in the design layout frame of reference. Registering may refer to transforming the coordinates of the detected anomaly to a common frame of reference, such as the coordinates of the design drawing of the integrated circuit being analyzed. Registrar 909 may receive data from a registration interpolator 910 as well as from an anomaly feature extractor 911. Registration interpolator 910 may be configured to create a model of the physical to design transformations of images received. In one embodiment, registration interpolator 910 may assign design coordinates to anomalies that do not have an image by assigning them the design coordinates of anomalies located close in proximity that do have an image. In another embodiment, registration interpolator 910 may create a model of all the location transformations performed with anomalies that have images. The model of the location transformations may be applied to determine the location of the anomalies that do not have images. Registration interpolator 910 may further be configured to assign design coordinates when the anomaly is not located in an image of the anomaly. Anomaly feature extractor 911 may be configured to discover and report where the anomaly is located when the design layout is aligned with the integrated circuit being analyzed.

Software system 900 may further include a routine correlator 912 configured to continuously store and execute scripts and algorithms that perform data manipulations and analysis, such as image processing, to report correlation and inferences to aid and improve the building of the integrated circuit and the relation of the built integrated circuit to the design functionality. Routine correlator 912 may be configured to receive input from registrar 909 and data miners 904. Routine Correlator 912 may be configured to output data to data miners 904.

Software system 900 may further include a design region manager 913 configured to select a region of the design layout that may be needed by other components of software system 900. For example, design region manager 913 may select a particular bit cell or quadrant of the die corresponding to an area around the detected anomaly. The area around the detected anomaly may include the layer containing the detected anomaly as well as a region of interest around the detected anomaly that includes associated layers. Design region manager 913 may be configured to receive an input from registrar 909, manufacturing enterprise system 907 as well as from synchronization monitor 914. Synchronization monitor 914 may be configured to maintain synchronization between the design layout image of the integrated circuit and the physical image, i.e., the integrated circuit. Synchronization monitor 914 may further be configured to move or update the design image if the image of the anomaly moves. Movement of the integrated circuit may be determined by motion detector 108, as explained above. Upon detecting movement of the integrated circuit, synchronization monitor 914 moves the design image displayed on display 238 (FIG. 2) accordingly. Design region manager 913 may further be configured to receive input from a tool driver manager 915. Tool drive manager 915 may be configured to manage communication to external tool drivers which may refer to software used to control the equipment that manufactures, tests or analyzes the integrated circuits. Design region manager 913 may be configured to output data to CAD database 113.

Software system 900 may further include a design image generator 916 configured to convert CAD data to a design layout image. For example, Design image generator 916 may receive design data that will be used by a software application to construct an image of the design layout. The design layout image may include a list of vectors and rules (such as design rules used for laying out the components of a design) which may be used to allow a user to view the design layout on display 238 (FIG. 2). Further, the vectors and rules in the design layout image may be used to compare the image file of the physical image of the integrated circuit to detect anomalies as described above. Design image generator 916 may receive the design data to be converted from CAD database 113 relating to a layout of interest. Design image generator 916 may output the design layout image to an image manager 917. Image manager 917 may be configured to manage images of integrated circuits needed by other processes. Image manger 917 may further be configured to store these images temporarily.

Software system 900 may further include a transform precision 918 configured to calculate and monitor the precision of design transformations stored in registrar 909. Transform precision 918 may be configured to receive image attributes such as pixel resolution and distances between image-alignment-based registrations from registrar 909 and an image aligner 919.

For example, if an anomaly has an image, then an alignment to the design layout may be performed. The anomaly may then be assigned the design layout coordinates once the alignment is complete. Another anomaly may also have an image and be given a design registration based on performing an alignment and registration. The distance between these two design registered anomalies is the vector distance between the two anomalies within the common, e.g., design, frame of reference. If a detected anomaly without an image needs registration, then the design coordinates of the detected anomaly may be determined through interpolation using one of the transforms for the anomalies with an image. If, for example, the transforms for the anomalies are not the same since the anomalies with images have physical coordinates that are not in the same frame of reference, then the anomaly without an image may be assigned design coordinates by averaging the two transforms to create a transform function for the anomaly without the image. If, however, there are a greater number of anomalies with images, then a model of the image-based registration transformations may be generated. The model may be able to accept the physical coordinates of anomalies without an image as inputs and output design coordinates that would be assigned to the anomalies without an image using the image-based registration transformations.

As stated above, transform precision 918 may be configured to receive image attributes such as pixel resolution and distances between image-alignment-based registrations from registrar 909 and an image aligner 919. Image aligner 919 may be configured to align the design image and the image of the integrated circuit containing the detected anomaly. Image aligner 919 may be configured to determine the location of the detected anomaly in terms of a common reference system as outlined in step 306 which includes the step of aligning the image of the detected anomaly with the design layout of the image. Transform precision 918 may be configured to output its data to registration interpolator 910.

Registration interpolator 910 may receive inputs from transform precision 918, registrar 909 and manufacturing enterprise system 907 and output its data to registrar 909.

Software system 900 may further include a graphical user interface 920 that may be configured to display a design layout, such as on display 238 (FIG. 2), so that a user of control unit 110 (FIGS. 1 and 2) may select a location in the design layout. Graphical user interface 920 may receive a design image from image manager 917 when the alignment of the design layout and the integrated circuit is designated as "poor." An alignment of the design layout and the integrated circuit may be designated as "poor" when the physical image does not contain sufficient feature information, e.g., contrast, edges, segment transitions, to allow alignment to be completely automatic or within a certain time period or where there are multiple alignment possibilities. Graphical user interface 920 may output its data to image aligner 919.

Synchronization monitor 914 may receive target positions from registration interpolator 910. Target positions may refer to directions and distances from the current position or from a design registered coordinate. Synchronization monitor 914 may further be configured to receive an alignment error vector from image aligner 919. An alignment error vector may refer to a vector that indicates the size and direction of the error in the alignment between the design drawing overlying the integrated circuit. Synchronization monitor 914 may further be configured to receive data from tool driver manager 915 involving the movement of stage 102 (FIG. 1). Synchronization monitor 914 may be configured to output its data to tool driver manager 915.

Tool driver manager 915 may be configured to receive input from synchronization monitor 914 and output its data to tool drivers 906, synchronization monitor 914 and to a tool stage Statistical Process Control (SPC) 931 which is described further below.

Software system 900 may further include an output manager 921 configured to manage reports, e.g., reports of the simulation of the detected anomaly, and system administrative information, e.g., design layout in the vicinity of the detected anomaly, anomaly image, list of possible causes of the anomaly, list of appropriate corrective actions, dimensions of the anomaly, impacted features, anomaly classification. Output manager 921 may be configured to receive input from a streamlined simulator 922 and a design anomaly classifier 923. Streamlined simulator 922 may be configured to simulate the impact of anomalies on device performance. Design anomaly classifier 923 may be configured to classify anomalies as described in step 311. Output manager 921 may be configured to output its data to manufacturing enterprise system 907 and graphical user interface 920.

Streamlined simulator 922 may be configured to receive layer and workflow (referring to the orderly procedures of business procedures and manufacturing operations related to building a device as it is designed to operate) data from manufacturing enterprise system 907, netlist data from physical netlist database 902 as well as image and anomaly attribute data from an image combiner 924. Image combiner 924 may be configured to overlay the detected anomaly and the appropriate design layout level. Image combiner 924 may further be configured to transform the design and physical image of the analyzed integrated circuit into a readable vector image. Streamlined simulator 922 may be configured to output its data to output manager 921.

Image combiner 924 may be configured to receive images from image manager 917 and alignment data from image aligner 919. Image combiner 924 may be configured to output its data to streamlined simulator 922.

Image manager 917 may be configured to receive images of the detected anomalies from inspection and review image database 903. Image manager 917 may further be configured to receive a design layout image from design image generator 916. Image manager 917 may further be configured to receive a design region of interest from design region manager 913 to determine which images are needed. Image manager 917 may be configured to transmit the design image and the image of the detected anomaly to image aligner 919. Image manager 917 may further be configured to transmit the design layout image and images of the detected anomaly to graphical user interface 920 when alignment is deemed to be "poor." Image manager 917 may further be configured to transmit its output to magnification calibrator 926 (described below) and image combiner 924.

Image aligner 919 may receive input from image manager 917 and receives an alignment starting point if alignment is deemed "poor" by synchronization monitor 914 if the image becomes unlocked, i.e., there is no longer a positional correspondence between the image and the design layout. Image aligner 919 outputs data to image combiner 924.

As stated above, design anomaly classifier 923 may be configured to classify anomalies as described in step 311. Design anomaly classifier 923 may be configured to receive input from registrar 909 and from streamlined simulator 922. Design anomaly classifier 923 may be configured to output its data to output manager 921 and data miners 904 via routine correlator 912.

Software system 900 may further include a magnification calibrator 926 and anomaly feature extractor 911. Magnification calibrator 926 may be configured to ensure the design image and the image of the anomaly is at the same magnification. Anomaly feature extractor 911 may further be configured to measure the size of the anomaly. Anomaly feature extractor 911 may also generate a representative shape of the anomaly and extract parameters of the shape to calculate or represent the size and orientation of the anomaly. For example, an oval may be used to represent an anomaly where the major and minor axis vectors are the parameters from which the size, orientation and area would be calculated.

Anomaly feature extractor 911 may further be configured to receive image data from image aligner 919 if the alignment of the design layout and the integrated circuit is successful. Anomaly feature extractor 911 may be configured to output the anomaly location to anomaly feature extractor 927. Anomaly feature extractor 911 may further be configured to output the anomaly location to registrar 909 if the anomaly is located. Anomaly feature extractor 911 may further be configured to output the anomaly location to anomaly classifier 923. Anomaly feature extractor 911 may further be configured to output the anomaly location to critical volume filter 928. Critical volume filter 928 may be configured to classify an anomaly automatically by its relation to a critical volume or a critical surface. That is, critical volume filter 928 may be configured to classify an anomaly in terms of either two-dimensional or a three-dimensional critical volume as described above.

Critical volume filter 928 may receive anomaly locations that have been registered from anomaly feature extractor 911. Critical volume filter 928 may further receive anomaly locations from registration interpolator 910. Critical volume filter 928 may further receive critical area and design rules from manufacturing enterprise system 907. Critical volume may refer to the three dimensional volume surrounding an aspect of the circuit layout where if an anomaly of a significant size were to occur within this volume then the anomaly would impact the designed function. For example, if a particle fell on a conductive path, such as a metal line close to where another metal line is to be connected, then the particle may interfere with the electrical connection between the two metal lines. The volume surrounding the metal line connection may be considered a critical volume. Design rules may refer to rules that are used for laying out the components of a design. Design rules may state the minimum space between two lines. This minimum space may be used to generate critical volume parameters such as radius values. For example, a metal line space of 500 nanometers may be required between two metal lines to prevent electrical signals from one metal line to interfere with the electrical signals on the other metal line. The critical volume around any single metal line may then be 500 nanometers. The design rule may then be that there could not be any particle 500 nanometers or greater in size from a metal line in order to ensure that the particle would not induce electrical interference between the metal lines. If the two metal lines are being placed further apart than the minimum spacing, then there is less of a chance of electrical interference between the two metal lines. In this case, the particle could be within 500 nanometers; however, the critical volume for such a particle may be less around those portions of the metal lines that are further than the minimum design rule space.

Critical volume filter 928 may further receive netlist data from physical netlist database 902. Critical volume filter 928 may be configured to output its data to output manager 921.

Software system 900 may further include a wafermap correlator 929 configured to correlate test and netlist registered data to registered anomalies. Wafermap correlator 929 may receive test scans from test database 901 and netlist traces from netlist database 902. WaferMap Correlator 929 may further be configured to receive registered anomalies from registrar 909. WaferMap Correlator 929 may be configured to output its data to an anomaly source locator 930 and routine correlator 912. Anomaly source locator 930 may be configured to analyze data from wafermap correlator 929 and data from data miners 904 to determine a possible source of the anomaly in the manufacturing workflow.

Magnification calibrator 926 may receive image information from image manager 917 and synchronization data from synchronization monitor 914. Magnification calibrator 926 may be configured to output a vector indicating the adjustment to the design image magnification to tool driver manager 915 and to synchronization monitor 914.

As stated above, anomaly source locator 930 may be configured to receive wafermap correlator correlation results from wafermap correlator 929 as well as receiving data from data miners 904. Anomaly source locator 930 may be configured to output its data to output manager 921. Further, anomaly source locator 930 may be configured to query data miners 904 via routine correlator 912 to determine the probability that the predicted source of the detected anomaly is correct.

Software system 900 may further include a tool stage Statistical Process Control (SPC) 931 configured to generate SPC data for stage movement device 107 to indicate the amount and direction stage movement device 107 should move stage 102. SPC may refer to a method of determining the criteria when a process is behaving normally or needs to be adjusted to achieve a certain outcome. Tool stage SPC 931 may be configured to receive the tool stage position data from tool driver manager 915 if the alignment of the design layout and the integrated circuit is successful. Tool stage SPC 931 may further be configured to receive alignment transforms from design anomaly classifier 923. Tool stage SPC 931 may be configured to output its data to output manager 921.

Software system 900 may further include a design-based overlay 932 configured to calculate the overlay registration of each layer to the design level rather than with respect to the other layers. That is, design-based overlay 932 may use the design layout frame of reference as the common frame of reference to measure the alignment of the physical pattern of one component to the physical pattern of another component. Design-based overlay 932 may be configured to receive design-registered features from registrar 909. Design-based overlay 932 may further be configured to receive alignment transformations from registrar 909. Design-based overlay 932 may further be configured to receive layer information (information about the layers of the integrated circuit being analyzed) from manufacturing enterprise system 907. Design-based overlay 932 may be configured to output its data to output manager 921.

Software system 900 may further include a design SPC 933 configured to perform statistical process control using design data and data registered to the common frame of reference. As stated above, statistical process control may refer to a method of determining the criteria when a process is behaving normally or needs to be adjusted to achieve a certain outcome. Statistical process control may be based on using statistical summaries of observable process parameters to monitor process stability and determine if a process modification will have the effect to maintain process outputs within desired tolerances. Examples of observable parameters include critical dimension, images from various recording devices at different illumination wavelengths (scanning election microscope images, optical images), in-line probe of voltage-current relationships, film thickness, and energy flux through an opening or energy flex reflected off a surface and layer overlay. Design SPC 933 may be configured to receive device functions, e.g., functions of the components of the integrated circuit, from streamlined simulator 922. Design SPC 933 may further be configured to receive device function targets from manufacturing enterprise system 907. A device function target may refer to a parameter value associated with the functionality of the device. For example, an operational amplifier may be configured to change its output from 0 to +5 volts in 10 nanoseconds. The device function targets in this example would be +5 volts as well as 10 nanoseconds. SPC 933 may be configured to output its data to output manager 921 and routine correlator 912.

Although the system, method and computer program product are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

The invention claimed is:

1. A method for assessing the impact of anomalies comprising the steps of:
   retrieving an image of a physical device;
   obtaining a design layout of said image; and
   registering said image of said physical device and said design layout of said image in a common frame of reference, wherein said step of registering said image of said physical device and said design layout of said image in said common frame of reference comprises the steps of:
      vectorizing said image of said physical device into closed polygons;
      matching polygons in said image with polygons in said design layout; and
      aligning said image with said design layout of said image using said matched polygons.

2. The method as recited in claim 1, wherein said step of registering said image of said physical device and said design layout of said image in said common frame of reference further comprises the step of:
   segmenting said image into objects.

3. The method as recited in claim 2, wherein said step of registering said image of said physical device and said design layout of said image in said common frame of reference further comprises the step of:
   defining a location of polygons in said image corresponding to polygons matched in said design layout of said image in terms of coordinates of said common frame of reference.

4. The method as recited in claim 3, wherein said image comprises an image of a first anomaly.

5. The method as recited in claim 4, wherein said step of registering said image of said physical device and said design layout of said image in said common frame of reference further comprises the steps of:
   re-identifying a location of said first anomaly in said image; and
   computing a coordinate transform to express said re-identified location of said first anomaly in said image in terms of coordinates of said common frame of reference.

6. The method as recited in claim 5 further comprising the step of:
   mapping said coordinates of said common frame of reference of said first anomaly onto netlist traces.

7. The method as recited in claim 6 further comprising the steps of:
   receiving values of one or more physical objects located in close proximity to said coordinates of said common frame of reference of said first anomaly; and
   simulating said physical device using said received values and said netlist traces to assess said first anomaly.

8. The method as recited in claim 7 further comprising the step of:
   generating a report, wherein said report comprises the results of said simulation.

9. The method as recited in claim 5 further comprising the step of:
   determining if said first anomaly is located in an area of said physical device critical to its operation.

10. The method as recited in claim 9, wherein said step of determining if said first anomaly is located in said area of said physical device critical to its operation comprises the step of:
    classifying said first anomaly by its relation to one of a three-dimensional volume and a two-dimensional area in close proximity to said coordinates of said common frame of reference.

11. The method as recited in claim 1, wherein said step of registering said image of said physical device and said design layout of said image in said common frame of reference further comprises the step of:
    aligning a bit map representation of said image with said bit map representation of said design layout.

12. The method as recited in claim 1, wherein said step of registering said image of said physical device and said design layout of said image in said common frame of reference further comprises the step of:
    aligning said image with said design layout of said image by identifying two or more landmarks in said physical device.

13. The method as recited in claim 12 further comprising the step of:
    maintaining positional correspondence between said image of said physical device with said design layout after said landmarks in said physical device are identified.

14. The method as recited in claim 13 further comprising the step of:
    detecting a first anomaly, wherein said first anomaly is detected by comparing a vector representation of a physical object in said physical device with a vector representation of a corresponding physical object in said design layout.

15. The method as recited in claim 14 further comprising the step of:
    mapping said coordinates of said common frame of reference of said first anomaly onto netlist traces.

16. The method as recited in claim 15 further comprising the steps of:
    receiving values of one or more physical objects located in close proximity to said coordinates of said common frame of reference of said first anomaly; and
    simulating said physical device using said received values and said netlist traces to assess said first anomaly.

17. The method as recited in claim 16 further comprising the step of:
    generating a report, wherein said report comprises the results of said simulation.

18. The method as recited in claim 14 further comprising the step of:

determining if said first anomaly is located in an area of said physical device critical to its operation.

19. The method as recited in claim 18, wherein said step of determining if said first anomaly is located in said area of said physical device critical to its operation comprises the step of:
   classifying said first anomaly by its relation to one of a three-dimensional volume and a two-dimensional area in close proximity to said coordinates of said common frame of reference.

20. The method as recited in claim 1, wherein said image comprises a first anomaly, wherein said step of registering said image of said physical device and said design layout of said image in said common frame of reference further comprises the steps of:
   computing an affine transformation between other images of said physical device and said design layout; and
   applying said affine transformation to said coordinates of said first anomaly in said frame of reference of said physical device to generate said coordinates of said common frame of reference.

21. The method as recited in claim 1, wherein said physical device is an integrated circuit.

22. The method as recited in claim 1, wherein said physical device is a mechanical device.

23. The method as recited in claim 1, wherein said physical device is an optical device.

24. A computer program product embodied in a machine readable medium for assessing the impact of anomalies comprising the programming steps of:
   retrieving an image of a physical device;
   obtaining a design layout of said image; and
   registering said image of said physical device and said design layout of said image in a common frame of reference, wherein said programming step of registering said image of said physical device and said design layout of said image in said common frame of reference comprises the programming steps of:
      vectorizing said image of said physical device into closed polygons;
      matching polygons in said image with polygons in said design layout; and
      aligning said image with said design layout of said image using said matched polygons.

25. The computer program product as recited in claim 24, wherein said programming step of registering said image of said physical device and said design layout of said image in said common frame of reference further comprises the programming step of:
   segmenting said image into objects.

26. The computer program product as recited in claim 25, wherein said programming step of registering said image of said physical device and said design layout of said image in said common frame of reference further comprises the programming step of:
   defining a location of polygons in said image corresponding to polygons matched in said design layout of said image in terms of coordinates of said common frame of reference.

27. The computer program product as recited in claim 26, wherein said image comprises an image of a first anomaly.

28. The computer program product as recited in claim 27, wherein said programming step of registering said image of said physical device and said design layout of said image in said common frame of reference further comprises the programming steps of:
   re-identifying a location of said first anomaly in said image; and
   computing a coordinate transform to express said re-identified location of said first anomaly in said image in terms of coordinates of said common frame of reference.

29. The computer program product as recited in claim 28 further comprising the programming step of:
   mapping said coordinates of said common frame of reference of said first anomaly onto netlist traces.

30. The computer program product as recited in claim 29 further comprising the programming steps of:
   receiving values of one or more physical objects located in close proximity to said coordinates of said common frame of reference of said first anomaly; and
   simulating said physical device using said received values and said netlist traces to assess said first anomaly.

31. The computer program product as recited in claim 30 further comprising the programming step of:
   generating a report, wherein said report comprises the results of said simulation.

32. The computer program product as recited in claim 28 further comprising the programming step of:
   determining if said first anomaly is located in an area of said physical device critical to its operation.

33. The computer program product as recited in claim 32, wherein said programming step of determining if said first anomaly is located in said area of said physical device critical to its operation comprises the programming step of:
   classifying said first anomaly by its relation to one of a three-dimensional volume and a two-dimensional area in close proximity to said coordinates of said common frame of reference.

34. The computer program product as recited in claim 24, wherein said programming step of registering said image of said physical device and said design layout of said image in said common frame of reference further comprises the programming step of:
   aligning a bit map representation of said image with said bit map representation of said design layout.

35. The computer program product as recited in claim 24, wherein said programming step of registering said image of said physical device and said design layout of said image in said common frame of reference further comprises the programming step of:
   aligning said image with said design layout of said image by identifying two or more landmarks in said physical device.

36. The computer program product as recited in claim 35 further comprising the programming step of:
   maintaining positional correspondence between said image of said physical device with said design layout after said landmarks in said physical device are identified.

37. The computer program product as recited in claim 36 further comprising the programming step of:
   detecting a first anomaly, wherein said first anomaly is detected by comparing a vector representation of a physical object in said physical device with a vector representation of a corresponding physical object in said design layout.

38. The computer program product as recited in claim 37 further comprising the programming step of:
   mapping said coordinates of said common frame of reference of said first anomaly onto netlist traces.

39. The computer program product as recited in claim 38 further comprising the programming steps of:

receiving values of one or more physical objects located in close proximity to said coordinates of said common frame of reference of said first anomaly; and simulating said physical device using said received values and said netlist traces to assess said first anomaly.

40. The computer program product as recited in claim 39 further comprising the programming step of:

generating a report, wherein said report comprises the results of said simulation.

41. The computer program product as recited in claim 37 further comprising the programming step of:

determining if said first anomaly is located in an area of said physical device critical to its operation.

42. The computer program product as recited in claim 41, wherein said step of determining if said first anomaly is located in said area of said physical device critical to its operation comprises the programming step of:

classifying said first anomaly by its relation to one of a three-dimensional volume and a two-dimensional area in close proximity to said coordinates of said common frame of reference.

43. The computer program product as recited in claim 24, wherein said image comprises a first anomaly, wherein said programming step of registering said image of said physical device and said design layout of said image in said common frame of reference further comprises the programming steps of:

computing an affine transformation between other images of said physical device and said design layout; and applying said affine transformation to said coordinates of said first anomaly in said frame of reference of said physical device to generate said coordinates of said common frame of reference.

44. The computer program product as recited in claim 24, wherein said physical device is an integrated circuit.

45. The computer program product as recited in claim 24, wherein said physical device is a mechanical device.

46. The computer program product as recited in claim 24, wherein said physical device is an optical device.

47. A system, comprising:

a memory unit operable for storing a computer program for assessing the impact of anomalies; and a processor coupled to said memory unit, wherein said processor, responsive to said computer program, comprises:

circuitry for retrieving an image of a physical device;

circuitry for obtaining a design layout of said image; and circuitry for registering said image of said physical device and said design layout of said image in a common frame of reference, wherein said circuitry for registering said image of said physical device and said design layout of said image in said common frame of reference comprises:

circuitry for vectorizing said image of said physical device into closed polygons;

circuitry for matching polygons in said image with polygons in said design layout; and circuitry for aligning said image with said design layout of said image using said matched polygons.

48. The system as recited in claim 47, wherein said circuitry for registering said image of said physical device and said design layout of said image in said common frame of reference further comprises:

circuitry for segmenting said image into objects.

49. The system as recited in claim 48, wherein said circuitry for registering said image of said physical device and said design layout of said image in said common frame of reference further comprises:

circuitry for defining a location of polygons in said image corresponding to polygons matched in said design layout of said image in terms of coordinates of said common frame of reference.

50. The system as recited in claim 49, wherein said image comprises an image of a first anomaly.

51. The system as recited in claim 50, wherein said circuitry for registering said image of said physical device and said design layout of said image in said common frame of reference further comprises:

circuitry for re-identifying a location of said first anomaly in said image; and circuitry for computing a coordinate transform to express said re-identified location of said first anomaly in said image in terms of coordinates of said common frame of reference.

52. The system as recited in claim 51, wherein said processor further comprises:

circuitry for mapping said coordinates of said common frame of reference of said first anomaly onto netlist traces.

53. The system as recited in claim 52, wherein said processor further comprises:

circuitry for receiving values of one or more physical objects located in close proximity to said coordinates of said common frame of reference of said first anomaly; and circuitry for simulating said physical device using said received values and said netlist traces to assess said first anomaly.

54. The system as recited in claim 53, wherein said processor further comprises:

circuitry for generating a report, wherein said report comprises the results of said simulation.

55. The system as recited in claim 51, wherein said processor further comprises:

circuitry for determining if said first anomaly is located in an area of said physical device critical to its operation.

56. The system as recited in claim 55, wherein said circuitry for determining if said first anomaly is located in said area of said physical device critical to its operation comprises:

circuitry for classifying said first anomaly by its relation to one of a three-dimensional volume and a two-dimensional area in close proximity to said coordinates of said common frame of reference.

57. The system as recited in claim 47, wherein said circuitry for registering said image of said physical device and said design layout of said image in said common frame of reference further comprises:

circuitry for aligning a bit map representation of said image with said bit map representation of said design layout.

58. The system as recited in claim 47, wherein said circuitry for registering said image of said physical device and said design layout of said image in said common frame of reference further comprises:

circuitry for aligning said image with said design layout of said image by identifying two or more landmarks in said physical device.

59. The system as recited in claim 58, wherein said processor further comprises:

circuitry for maintaining positional correspondence between said image of said physical device with said design layout after said landmarks in said physical device are identified.

60. The system as recited in claim 59, wherein said processor further comprises:
circuitry for detecting a first anomaly, wherein said first anomaly is detected by comparing a vector representation of a physical object in said physical device with a vector representation of a corresponding physical object in said design layout.

61. The system as recited in claim 60, wherein said processor further comprises:
circuitry for mapping said coordinates of said common frame of reference of said first anomaly onto netlist traces.

62. The system as recited in claim 61, wherein said processor further comprises:
circuitry for receiving values of one or more physical objects located in close proximity to said coordinates of said common frame of reference of said first anomaly; and
circuitry for simulating said physical device using said received values and said netlist traces to assess said first anomaly.

63. The system as recited in claim 62, wherein said processor further comprises:
circuitry for generating a report, wherein said report comprises the results of said simulation.

64. The system as recited in claim 60, wherein said processor further comprises:
circuitry for determining if said first anomaly is located in an area of said physical device critical to its operation.

65. The system as recited in claim 64, wherein said circuitry for determining if said first anomaly is located in said area of said physical device critical to its operation comprises:
circuitry for classifying said first anomaly by its relation to one of a three-dimensional volume and a two-dimensional area in close proximity to said coordinates of said common frame of reference.

66. The system as recited in claim 47, wherein said image comprises a first anomaly, wherein said circuitry for registering said image of said physical device and said design layout of said image in said common frame of reference further comprises:
circuitry for computing an affine transformation between other images of said physical device and said design layout; and
circuitry for applying said affine transformation to said coordinates of said first anomaly in said frame of reference of said physical device to generate said coordinates of said common frame of reference.

67. The system as recited in claim 47, wherein said physical device is an integrated circuit.

68. The system as recited in claim 47, wherein said physical device is a mechanical device.

69. The system as recited in claim 47, wherein said physical device is an optical device.

* * * * *